United States Patent
Song et al.

(10) Patent No.: US 12,372,688 B2
(45) Date of Patent: Jul. 29, 2025

(54) OPTICAL FILTER AND SENSOR SYSTEM COMPRISING THE SAME, AND METHOD FOR PREPARING HALOGENATED AMORPHOUS SILICON THIN FILM FOR OPTICAL FILTER

(71) Applicant: Young Jin Song, Yongin-si (KR)

(72) Inventors: Young Jin Song, Yongin-si (KR); Chang Kwon Hwangbo, Incheon (KR)

(73) Assignee: Young Jin Song, Yongin-si (KR)

( * ) Notice: Subject to any disclaimer, the term of this patent is extended or adjusted under 35 U.S.C. 154(b) by 808 days.

(21) Appl. No.: 17/627,680

(22) PCT Filed: Jul. 22, 2020

(86) PCT No.: PCT/KR2020/009630
§ 371 (c)(1),
(2) Date: Jan. 16, 2022

(87) PCT Pub. No.: WO2021/020800
PCT Pub. Date: Feb. 4, 2021

(65) Prior Publication Data
US 2022/0244430 A1    Aug. 4, 2022

(30) Foreign Application Priority Data

Jul. 26, 2019 (KR) .................. 10-2019-0090729
Oct. 29, 2019 (KR) .................. 10-2019-0135024

(51) Int. Cl.
*G02B 1/115* (2015.01)
*C23C 14/22* (2006.01)
*G02B 5/28* (2006.01)

(52) U.S. Cl.
CPC .............. *G02B 1/115* (2013.01); *C23C 14/22* (2013.01); *G02B 5/28* (2013.01)

(58) Field of Classification Search
None
See application file for complete search history.

(56) References Cited

U.S. PATENT DOCUMENTS

| 4,700,080 A | * | 10/1987 | Fukaya | ............... H10F 39/8053 359/885 |
| 4,720,444 A | * | 1/1988 | Chen | .................. G03G 5/08214 257/183.1 |

(Continued)

FOREIGN PATENT DOCUMENTS

| CN | 104471449 A | 3/2015 |
| CN | 108680981 A | 10/2018 |

(Continued)

OTHER PUBLICATIONS

Augelli et al (Physical characterization of halogenated and hydrogenated amorphous silicon films, This solid Films, vol. 69, pp. 315-320, 1990). (Year: 1990).*

*Primary Examiner* — Jyotsna V Dabbi
(74) *Attorney, Agent, or Firm* — Han's Law Office (57) ABSTRACT

An optical filter according to an embodiment of the present invention comprises a first mirror layer where a first high refraction material layer and a first low refraction material layer are alternately deposited, a spacer layer continuously deposited above one side surface of the first mirror layer, and comprises a plurality of second high refraction material layers, and a second mirror layer located to face the first mirror layer with the spacer layer interposed therebetween, and where a third high refraction material layer and a third low refraction material layer are alternately deposited.

11 Claims, 4 Drawing Sheets

(56) References Cited

U.S. PATENT DOCUMENTS

| | | | | |
|---|---|---|---|---|
| 6,631,033 B1* | 10/2003 | Lewis | ................... | G02B 5/288 |
| | | | | 359/590 |
| 2002/0114068 A1 | 8/2002 | Kuschnereit et al. | | |
| 2014/0014838 A1* | 1/2014 | Hendrix | ................... | H04N 5/33 |
| | | | | 359/359 |

FOREIGN PATENT DOCUMENTS

| | | | |
|---|---|---|---|
| JP | 2005070752 | A | 3/2005 |
| JP | 2006079067 | A | 3/2006 |
| JP | 2006-256310 | A | 9/2006 |
| JP | 2016-109809 | A | 6/2016 |
| JP | 2018063449 | A | 4/2018 |
| KR | 10-2011-0073568 | A | 6/2011 |
| KR | 10-2015-0031336 | A | 3/2015 |
| KR | 10-2018-0093805 | A | 8/2018 |

\* cited by examiner

OPTICAL FILTER AND SENSOR SYSTEM COMPRISING THE SAME, AND METHOD FOR PREPARING HALOGENATED AMORPHOUS SILICON THIN FILM FOR OPTICAL FILTER

FIELD

The present disclosure relates to an optical filter and sensor system comprising the same, and method for preparing halogenated amorphous silicon thin film for optical filter.

BACKGROUND

In general, motion recognition and facial recognition, etc., used in smart phones, game consoles, automobiles and the like, direct light emitted from a lighting device that uses LD or LED as light source, to a subject, and utilize information of the subject included in the light reflected from the subject.

Such a reflected light is converted into electrical signals in a sensor, and are then analyzed and processed, to obtain 3D information of the subject. In addition, in the process where the light reflected from the light source is reflected by the subject and detected in the sensor, the amount of light decreases in inverse proportion to the square of the distance from the light source and the subject and from the subject and the sensor, and due to the low reflectivity of the subject to the light source, the light reaching the sensor has a very low optical intensity compared to the amount of light emitted from the light source. Further, the ambient light distributed around the sensor system causes high noise characteristics in the sensor system. Therefore, an optical filter is required that can transmit only a narrow band wavelength in the range of about 800 nm to 1100 nm depending on the type and characteristics of the light source. Here, the optical filter must have high transmission characteristics in the narrow band being used, and must be able to block other bands through reflection or absorption processes.

In the conventional optical filter field, attempts are being made to deposit, on top of a base material such as glass having a high transmittance in about 800 nm to 1100 nm range, $TiO_2$, $Nb_2O_5$, $Ta_2O_5$, $Si_3N_4$ and the like as high refraction optical deposition materials, and $SiO_2$, $MgF_2$, $Al_2O_3$ and the like as low refraction optical deposition materials, or use mixtures with the high refraction optical materials and deposit the high refraction optical material and the low refraction optical material alternately, to enable transmittance or reflection in the target band, and obtain high refractive indexes using hydrogenated silicon.

Since a light reflected from a subject and incident on a sensor is distributed at a wide angle from 0 to 180 degrees, in order to construct a high-performance sensor system, a filter that allows a high Angle of Incidence (AOI) must be prepared. However, with conventional optical filters using high and low refraction materials, it is difficult to maintain the optical properties obtained at normal incidence because the refractive index changes according to polarization at an AOI of ±15 degrees or more. Therefore, in order to prepare a filter having high optical properties for a wide angle with an AOI of 15 degrees or more, a deposition material having a high refractive index and a low extinction coefficient is required.

A lot of research on silicon has been preceded over the past few decades, especially in the fields of large-area flat panel displays such as LCD and solar cells. Solid silicon, which is one of hydrogenated amorphous silicons, has a band gap of about 1.12 eV (@300K), and its absorption edge is located at about 1100 nm. Thus, it used to be difficult to use solid silicon in optical filters that absorb light in the near-infrared range of about 800 nm to 1100 nm and requires high transmittance. However, the band gap of hydrogenated amorphous silicons (a-Si:H) moved to have the absorption edge at about 1.75 eV-2.0 eV depending on the amount of hydrogen atoms in the amorphous silicon and the state of the silicon crystal, and was able to obtain the properties of having a relatively low absorption coefficient optically in the near-infrared region of about 700 nm or above, and recently there have been attempts to use this in optical filters.

Here, in order to minimize the optical absorption (extinction coefficient of about 0.001 or below), a hydrogen concentration close to or higher than about 20% is injected into the amorphous silicon to adjust the localized states and the band tail of the amorphous silicon. However, as a result of this, besides the intended hydrogenated amorphous silicon (a-Si:H), $Si:H_2$, $(Si:H_2)n$, Void and $Si:H_2+(Si:H_2)n$ compounds in chain or network form are simultaneously produced, consequently providing a cause for lowering the refractive index, and thus efforts to reduce this is required.

Further, in a hydrogenated amorphous silicon, hydrogen atoms have small molecular weight and very small size, so they can be easily obtained through diffusion in PVD or CVD processes. However, it is difficult to precisely control the amount of hydrogen because the diffusion coefficient changes significantly according to temperature, and during the process or after the process is completed, when the temperature rises, the hydrogen existing inside the silicon moves, accompanied by changes in the physical properties.

Especially, in optical filters, properties of the designed optical thin film of each layer are determined by the optical thickness, nd (n: optical refractive index, d: physical thickness). Therefore, even when the physical thickness, d, is constant, if the optical refractive index, n, is changed, the properties of the optical filter may change, and thus a problem may occur in the sensor system that includes the optical filter.

SUMMARY

An embodiment of the present disclosure is to provide an optical filter that has a high refractive index and at the same time shows a low extinction coefficient in a narrow band of about 800 nm to 1100 nm, and a sensor system including the same.

Further, an embodiment of the present disclosure is to provide an optical filter capable of accommodating a wide range of incidence angles and a sensor system including the same.

Besides the above tasks, embodiments of the present disclosure may be used to achieve other tasks, not specifically mentioned herein.

An embodiment of the present disclosure provides an optical filter including a first mirror layer where a first high refraction material layer and a first low refraction material layer are alternately deposited; a spacer layer continuously deposited above one side surface of the first mirror layer, and includes a plurality of second high refraction material layers; and a second mirror layer located to face the first mirror layer with the spacer layer interposed therebetween, and where a third high refraction material layer and a third low refraction material layer are alternately deposited.

One or more of the first high refraction material layer, the first low refraction material layer, the second high refraction material layer, the third high refraction material layer, and the third low refraction material layer may include a halogenated amorphous silicon.

In a wavelength range of 800 nm to 1100 nm, one or more of the first high refraction material layer, the second high refraction material layer, and the third high refraction material layer may have a refractive index of 3.0 or more, and an optical extinction coefficient of 0.001 or below.

A ratio of (optical thickness of the first high refraction material layer/optical thickness of the first low refraction material layer) or (optical thickness of the third high refraction material layer/optical thickness of the third low refraction material layer) may be about 1.5 to 3.0.

The halogenated amorphous silicon may include F or Cl.

The optical filter may have a transmission band of a wavelength range of 800 nm to 1100 nm, and a central wavelength of 950 nm may be band shifted to below 25 nm at most according to an incidence angle change of 0 to 45 degrees.

The optical filter may have a transmission band of a wavelength range of 800 nm to 1100 nm, and a central wavelength of 950 nm may be band shifted to below 38 nm at most according to an incidence angle change of 0 to 60 degrees.

The first high refraction material layer, the second high refraction material layer, and the third high refraction material layer may have a refractive index identical to one another, and the first low refraction material layer and the third low refraction material layer may have a refractive index identical to each other.

One or more of the first high refraction material layer, the first low refraction material layer, the second high refraction material layer, the third high refraction material layer, and the third low refraction material layer may include a halogenated amorphous silicon.

The halogenated amorphous silicon may be prepared using a PVD method including a step of introducing an inert gas, a halogen gas and a carrier gas into a chamber, and a ratio of volume of the halogen gas/(volume of the halogen gas+volume of the carrier gas) being introduced into the chamber during a same period of time may be above 0 and below 0.375.

The first low refraction material layer and the third low refraction material layer may include one or more of $TiO_2$, $Nb_2O_5$, $Ta_2O_5$, $Si_3N_4$, $SiO_2$, $MgF_2$, $Al_2O_3$, halogenated amorphous silicon compound, or a mixture thereof.

An embodiment of the present disclosure provides a method for preparing a halogenated amorphous silicon thin film for optical filter, being prepared using a PVD method including a step of introducing an inert gas, a halogen gas, and a carrier gas into a chamber, and a ratio of volume of the halogen gas/(volume of the halogen gas+volume of the carrier gas) being introduced into the chamber during a same period of time is above 0 and below 0.375.

An embodiment of the present disclosure provides a sensor system including the optical filter according to an embodiment of the present disclosure, a light source emitting light of a wavelength range of 800 nm to 1100 nm in order to generate a reflected light reaching the optical filter; and a sensor disposed on a processing path of the reflected light passing through the optical filter, and receives 3D information about a subject, included in the reflected light.

An optical filter and sensor system including the same according to one embodiment of the present disclosure may have a high refractive index and at the same time show a low extinction coefficient property in a narrow band of about 800 nm to 1100 nm.

By a method for preparing a halogenated amorphous silicon thin film according to one embodiment of the present disclosure, it is possible to prepare an optical filter having a high refractive index and at the same time showing a low extinction coefficient property in a narrow band of about 800 nm to 1100 nm.

Further, an optical filter and sensor system including the same according to one embodiment of the present disclosure may accommodate a wide range of incidence angles.

DETAILED DESCRIPTION

The terminology used herein is for the purpose of referring to particular embodiments only and is not intended to limit the present disclosure. As used herein, the singular forms also include the plural forms unless the phrases clearly indicate the opposite.

The meaning of "comprising/including," as used herein, specifies a particular characteristic, region, integer, step, operation, element, and/or component, and does not exclude existence or addition of other specific characteristic, region, integer, step, operation, element, component and/or group.

In the drawings in the present specification, the thicknesses have been enlarged to clearly express various layers and regions. When it is described that a part such as a layer, film, region, plate and the like is "above/on top of" another part, it may not only include cases where the part is "directly above" the other part, but also cases where there is another part in between. Meanwhile, when it is described that a part is "directly above/on top of" another part, it means there is no other part in between. On the other hand, when it is described that a part such as a layer, film, region, plate and the like is "below" another part, it may not only include cases where the part is "directly below" the other part, but also cases where there is another part in between. Meanwhile, when it is described that a part is "directly below" another part, it means there is no other part in between.

Although not defined otherwise, all terms including technical terms and scientific terms used herein have the same meaning as those commonly understood by those of ordinary skill in the art to which the present disclosure belongs. Commonly used terms defined in the dictionary are additionally interpreted as having a meaning consistent with the related technical literature and the presently disclosed content, and unless defined, are not interpreted in an ideal or very formal meaning.

In the present specification, a design formula of an optical filter may be shown as below.

$$\text{Glass}/(HL)^n\,2mH(LH)^n/\text{Air, or Glass}/(LH)^n\,2mL(HL)^n/\text{Air} \quad [\text{DESIGN FORMULA}]$$

(H denotes high refraction material layer, L denotes low refraction material layer, n denotes the number of repetitions of deposition of the high refraction material layer and the low refraction material layer set, and m denotes an integer greater than or equal to 1).

Further, optical thickness of the high refraction material layer or the low refraction material layer in the present specification may be shown as Formula 1 below.

$$nd=(1/4)\lambda_0 \quad \text{[Formula 1]}$$

(n denotes refractive index, d denotes physical thickness, and $\lambda_0$ denotes central wavelength of the light passing through the optical filter)

The optical thickness of a spacer layer in the present specification may be shown as Formula 2 below.

$$nd=(1/2)m\lambda_0 \quad \text{[Formula 2]}$$

(n denotes refractive index, d denotes physical thickness, m denotes m of the abovementioned design formula, and $\lambda_0$ denotes the central wavelength of the light pasting through the optical filter).

The meaning of 'high refraction' and 'low refraction' in the present specification may be interpreted according to the concept of relative refractive indexes between optical materials located at each layer for controlling the light transmittance and reflection properties, that may be understood by a person with ordinary knowledge in the field of optical filter.

Figure 1:
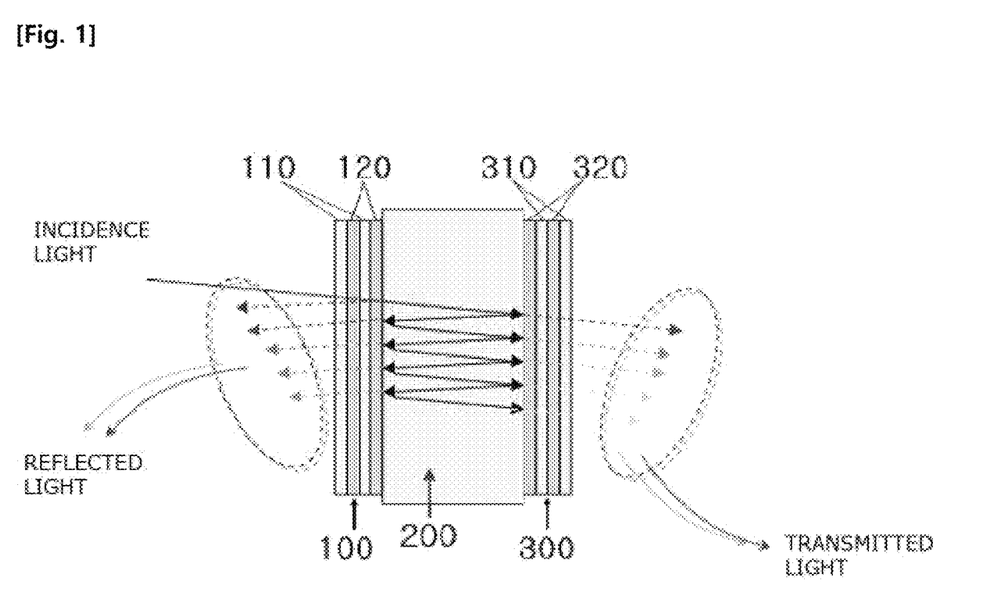
FIG. 1 is a cross-sectional view of a deposited structure of an optical filter according to an embodiment of the present disclosure.

FIG. 1 is a cross-sectional view showing a deposited structure of an optical filter 1020 according to an embodiment of the present disclosure.

Figure 2:
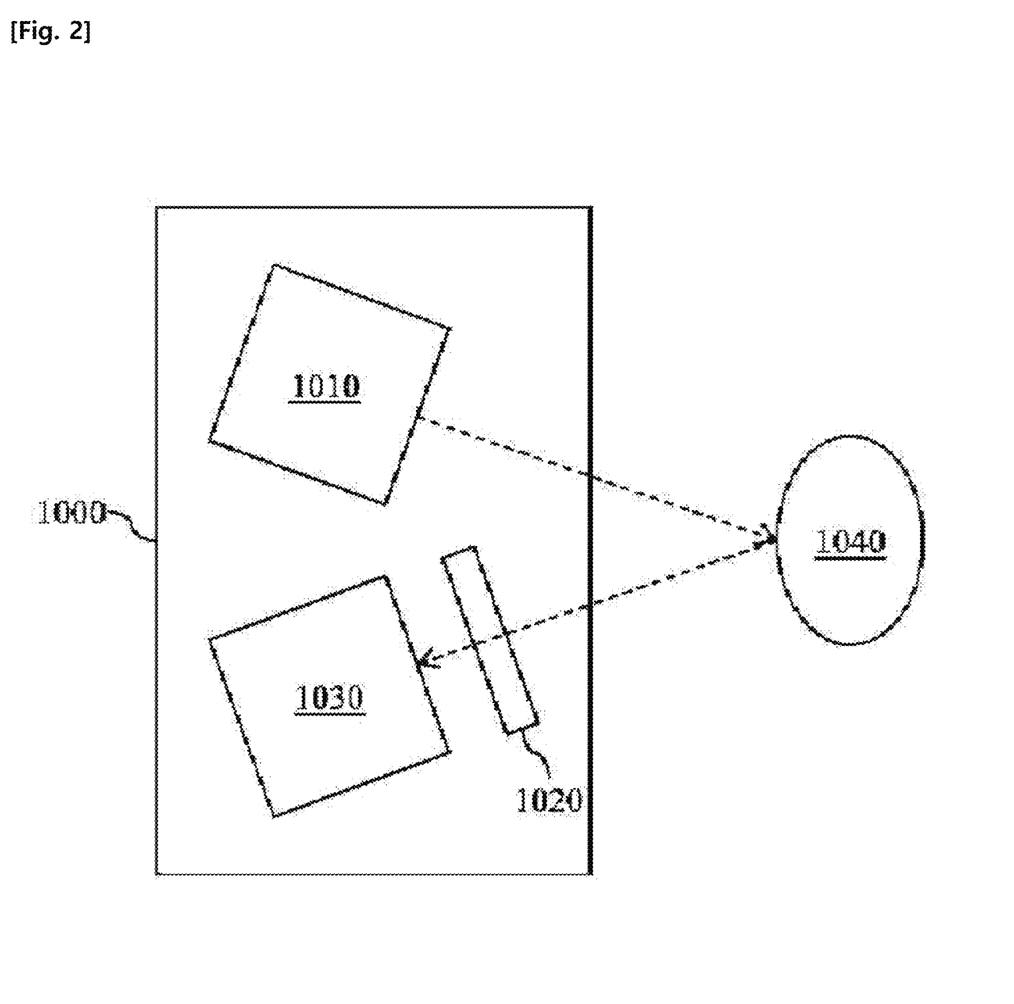
FIG. 2 is view illustrating a basic configuration of a sensor system according to an embodiment of the present disclosure.

FIG. 2 is a view illustrating the basic configuration of a sensor system 1000 according to an embodiment of the present disclosure.

Referring to FIG. 1 and FIG. 2, in an embodiment of the present disclosure, an optical filter 1020 is provided, that includes a first mirror layer 100 where a first high refraction material layer 110 and a first low refraction material layer 120 are alternately deposited, a spacer layer 200 continuously deposited above one side surface of the first mirror layer 100, and includes a plurality of second high refraction material layers, and a second mirror layer 300 located to face the first mirror layer 100 with the spacer layer 200 interposed therebetween, and where a third high refraction material layer 310 and a third low refraction material layer 320 are alternately deposited.

The optical filter 1020 according to an embodiment of the present disclosure may be formed not only in a single cavity structure shown in FIG. 1, but also in a multi cavity structure where the structure of the single cavity unit is deposited continuously repeatedly by two or more times.

First, an incident light entering the optical filter 1020 may be transmitted or reflected in the order of the first mirror layer 100, the spacer layer 200, and the second mirror layer 300, according to the wavelength range. Alternatively, the reverse order is also possible.

The spacer layer 200 is a layer located between the first mirror layer 100 and the second mirror layer 300, and may include a high refraction material layer.

When an incident light is incident at an oblique angle instead of a perpendicular angle, as P-polarized light and S-polarized light are separated and the incidence angle increases, the central wavelength of the two polarized lights move to shorter wavelengths, and at the same time, depending on the wavelengths, the two polarized lights change to different transmittances, and consequently, become the cause of deteriorating the performance of the optical filter. In order to improve this, if one or more of the first high refraction material layer 110, the third high refraction material layer 310, and the spacer layer 200 are comprised of a material having a high optical refractive index, for larger angles of incidence, the amount of change in the transmittance according to the wavelength of the S-polarized light and the P-polarized light can be reduced, thereby allowing for a greater angle of incidence. Therefore, for the spacer layer 200, when a high refraction material layer is used rather than a low refraction material layer, it is possible to prepare an optical filter that allows a greater angle of incidence.

One or more of the first high refraction material layer 110, the first low refraction material layer 120, the second high refraction material layer, the third high refraction material layer 310, and the third low refraction material layer 320 may include a halogenated amorphous silicon.

The halogenated amorphous silicon may include F or Cl.

Specifically, it is possible to position chlorine (atomic radius of Cl is 100 pm) or fluoride (atomic radius of F is 50 pm) that have a similar atomic radius as silicon (atomic radius of Si is 111 pm) in a dangling bond, and adjust the Density of State (DOS) within the band gap of the amorphous silicon so as to have a high optical refractive index of about 3.0 or above and a low optical extinction coefficient of about 0.001 or below in about 800 nm to 1100 nm that is near-infrared band, and prepare an optical filter that requires a high temperature reliability through a relatively low diffusion coefficient according to temperature compared to hydrogen atoms.

As described above, in the wavelength range of about 800 nm to 1100 nm, one or more of the first high refraction material layer 110, the second high refraction material layer and the third high refraction material layer 310 may have a refractive index of about 3.0 or above, and an optical extinction coefficient of about 0.001 or below. However, if the refractive index of the first high refraction material layer 110, the second high refraction material layer and the third high refraction material layer 310 exceeds about 4.0, absorption of light may occur, making it difficult to prepare a filter that actually has a high transmittance.

The first high refraction material layer 110, the first low refraction material layer 120, the second high refraction material layer, the third high refraction material layer 310 and the third low refraction material layer 320, that include a halogenated amorphous silicon may each be prepared in a PVD or CVD method.

For example, when preparing in the PVD method, silicon is positioned in a cathode, and then DC-sputtering or rf-sputtering is done to deposit the silicon cathode above a base material that it faces, wherein in order to generate plasma, Argon (Ar) is used as an inert gas. In addition, in order to make a halogen amorphous silicon, chlorine (Cl) or a compound gas ($SiCl_4$, $SiF_4$) containing chlorine or fluorine may be injected together as a reaction gas to form plasma, and it may react with sputtered silicon to form a halogenated silicon above the base material. Here, as a carrier gas, highly reactive hydrogen ($H_2$) or gaseous hydrochloric acid (HCl) may be used. The refractive index of the halogenated amorphous silicon can be controlled by controlling the amount of gas containing the halogen material injected, the temperature of the base material, and DC or rf power related to the depositing speed of the amorphous silicon. To improve the chemical bonding of the halogen material with silicon, a separate plasma source or ion source with a high plasma density is used to increase the density of halogens (Cl, F) located in the dangling bond of amorphous silicon to obtain an optical extinction coefficient that is lower than about 0.0005. Further, as the halogen element is located in the dangling bond, the effect of reducing the compressive stress existing in the optical filter thin film can be obtained at the same time.

When preparing a halogenated amorphous silicon in a thin film form using the PVD method that includes a step of introducing an inert gas, halogen gas and carrier gas into a chamber, the ratio of volume of the halogen gas/(volume of the halogen gas+volume of the carrier gas) introduced into the chamber within the same period of time may be greater than about 0 to less than 0.375.

When the volume ratio of the gas being introduced into the chamber within the same period of time is within the above-mentioned range, the optical filter including the halogenated amorphous silicon according to an embodiment of the present disclosure may show a refractive index that is higher than a hydrogenated amorphous silicon used as an optical filter, and an equivalent level of optical extinction coefficient at the same time.

Here, the halogen gas may be chlorine (Cl) or a compound gas ($SiCl_4$, $SiF_4$) containing chlorine (Cl) or fluorine as a reactive gas, and the carrier gas may be highly reactive hydrogen ($H_2$) or gaseous hydrochloric acid (HCl). Such a halogenated amorphous silicon thin film may be used for preparing an optical filter.

The ratio of (optical thickness of the first high refraction material layer 110/optical thickness of the first low refraction material layer 120) or (optical thickness of the third refraction material layer 310/optical thickness of the third low refraction material layer 320) may be about 1.5 to 3.0. In the aforementioned range, it is possible to accommodate a wide range of incidence angles, and the internal stress of the material layer thin film is minimized, making it possible to prepare an economical optical filter using a thin base material.

Specifically, the optical filter 1020 according to an embodiment of the present disclosure may have a transmission band of a wavelength range of about 800 nm to 1100 nm which is a near infrared band, and a central wavelength of 950 nm may be band shifted to below 25 nm at most according to an incidence angle change of about 0 to 45 degrees. Further, it may be band shifted to below 38 nm at most according to an incidence angle change of about 0 to 60 degrees.

The first high refraction material layer 110, the second high refraction material layer, and the third high refraction material layer 310 may have a refractive index identical to one another, and the first low refraction material layer and the third low refraction material layer may have a refractive index identical to each other. It is possible to select materials for the first high refraction material layer 110, the second high refraction material layer, and the third high refraction material layer 310 to have different refractive indexes from one another, and for the first low refraction material layer 120 and the third low refraction material layer 320 to have different refractive indexes from each other, but since numerous types of material sources (in the case of sputter, numerous different cathodes) are required at the preparing stage, problems such as complexity of preparing equipment, and the processes and cost to operate them may occur. These problems can be improved by using materials having an identical refractive index.

The first low refraction material layer 120 and the third low refraction material layer 320 may include any one or more of $TiO_2$, $Nb_2O_5$, $Ta_2O_5$, $Si_3N_4$, $SiO_2$, $MgF_2$, $Al_2O_3$, halogenated amorphous silicon compound or a mixture thereof.

Generally, $TiO_2$, $Nb_2O_5$, $Ta_2O_5$, $Si_3N_4$ have refractive indexes in the range of about 2.0 to 2.3, and thus they can be classified as high refraction materials. However, since the halogenated amorphous silicon of the optical filter 1020 according to an embodiment of the present disclosure has a high refractive index (about 3.0 to 4), relatively, $TiO_2$, $Nb_2O_5$, $Ta_2O_5$, $Si_3N_4$ or mixture thereof can be used as low refraction materials and thus besides the low refraction materials such as $SiO_2$, $Al_2O_3$, $MgF_2$ that have been generally used in prior art, one or more of $Nb_2O_5$, $Ta_2O_5$, $Si_3N_4$ can be additionally selected and applied, thus widening the selection range of optical filter materials. Further, it is possible to prepare with different refractive indexes by adjusting the processing conditions at the thin film depositing step of the compound including the halogenated amorphous silicon, thus preparing not only a high refraction material layer including the halogenated amorphous silicon compound but also a low refraction material layer.

FIG. 2 is a view illustrating the base configuration of a sensor system 1000 according to an embodiment of the present disclosure.

Referring to FIG. 2, an embodiment of the present disclosure provides a sensor system 1000 that includes the optical filter 1020 according to an embodiment of the present disclosure, a light source 1010 emitting light in the wavelength range of about 800 nm to 1100 nm in order to generate a reflected light reaching the optical filter 1020, and a sensor 1030 disposed on a processing path of the reflected light passing through the optical filter 1020, and receives 3D information about a subject 1040 included in the reflected light.

Other elements such as optics that are commonly included in the sensor system 1000 are omitted for simplicity of illustration.

The light source 1010 emits light in an emission wavelength within the wavelength range of about 800 nm to 1100 nm. The light source 1010 emits modulated light, for example, light pulses. Desirably, the light source 1010 may be a light-emitting diode (LED), an LED array, a laser diode, or a laser diode array.

Since the light source 1010 emits light towards the subject 1040, the subject 1040 reflects the emitted light towards the sensor system 1000 again. If the sensor system 1000 is a gesture-recognition system, the subject 1040 is the user of the gesture-recognition system.

The optical filter 1020 is disposed to receive the emitted light after the reflection by the subject 1040. The optical filter 1020 has a transmittance band that includes an emission wavelength and at least partially overlaps with the wavelength range of about 800 nm to 1100 nm. The optical filter 1020 may be a band transmittance filter, preferably a narrow-band transmission filter as described above. The optical filter 1020 transmits the light emitted from the light source 1010 while substantially blocking ambient light. In short, the optical filter 1020 receives the light emitted from the light source 1010 and reflected by the subject 1040, and transmits the emitted light to the sensor 1030.

The sensor 1030 is disposed to receive the emitted light transmitted by the optical filter 1020, and thus, the sensor 1030 may be disposed behind the optical filter 1020. In some cases, the optical filter 1020 may be directly formed on the sensor 1030, and disposed on the sensor 1030.

If the sensor system 1000 is a proximity sensor system, the sensor 1030 is a proximity sensor, and thus the proximity sensor may detect the emitted light and sense the proximity of the subject 1040 according to methods well known in the technical field of the present disclosure. If the sensor system 1000 is a 3D-imaging system or a gesture-recognition system, the sensor 1030 is a 3D image sensor, for example, a charge-coupled device (CCD) chip or complementary metal oxide semiconductor (CMOS) chip, and thus the CCD or CMOS chip may detect the emitted light and provide 3D images of the subject 1040, and the subject 1040 may be the user in some cases. The 3D image sensor may convert optical information into electrical signals according to methods well known in the technical field of the present disclosure for processing by a processing system, for example, an application-specific integrated circuit (ASIC) or digital signal processing (DSP). For example, if the sensor system 1000 is a gesture-recognition system, the processing system may recognize the user's gesture by processing the 3D images of the user.

By including the optical filter 1020 according to an embodiment of the present disclosure, it is not only possible to have a high refractive index and at the same time show low extinction coefficient properties in the narrow band of about 800 nm to 1100 nm, but also receive incidence angles of a wide range of about 0 to 60 degrees.

Although preferred embodiments of the present disclosure have been described in detail above, the scope of the present disclosure is not limited thereto, and various modifications and improved forms by those skilled in the art using the basic concept of the present disclosure as defined in the following claims are also within the scope of rights of the present disclosure.

Example 1

Designing Optical Filter

Using the optical thin film design software programs generally used in the current research or industrial field, an optical filter is designed as below as Comparative examples and Examples.

Comparative examples 1 to 4 and Examples 1 to 4 are designed according to the optical filter design formula below.

Glass(1.52)/(HL)^n 2mH (LH)^n/Air(1.0),(H:a@$\lambda_1$ nm,L:b@$\lambda_2$ nm)     [Design Formula]

(H denotes high refraction material layer, L denotes low refraction material layer, n denotes the number of repetitions of deposition of the high refraction material layer and the low refraction material layer, m denotes an integer greater than or equal to 1, a denotes refractive index of the high refraction material layer in $\lambda_1$ wavelength, b denotes refractive index of the low refraction material layer in $\lambda_2$ wavelength, the refractive index of Glass is set to 1.52, the refractive index of Air is set to 1.0, and ratio of optical thickness of H and L is 1:1)

Comparative example 1 is Glass(1.52)/(HL)^4 2mH (LH)^4/Air(1.0), (H: 3.6@950 nm, L: 2.5@950 nm)m and halogenated silicon oxide (a-Si:Cl:H) is applied to the high refraction material layer, and halogenated silicon oxide (a-SiOx:Cl) is applied to the low refraction material layer.

Comparative example 2 is Glass(1.52)/(1.1H0.9L)^4 (2m+0.0783)H (0.9L1.1H)^4/Air(1.0), and besides changing the ratio of optical thickness of the high refraction material layer and the low refraction material layer, the same designing conditions apply as Comparative example 1. Here, in the above design formula, 0.0783 is a compensation value for the purpose of minimizing loss from resonance at the intending central wavelength, by compensating for the change of resonant wavelength caused by changes in the mirror layer located at a front or back of the spacer layer. Specifically, it may be derived by calculating an optical admittance of each layer constituting the mirror layer and thereby obtaining a compensation value corresponding thereto or by using a program. In addition, the same may be applied to the design formula in Comparative examples 3 and 4, and Examples 1 to 4.

Comparative example 3 is Glass(1.52)/(1.15H0.85L)^4 (2m+0.1173)H(0.85L1.15H)^4/Air(1.0), and besides changing the ratio of optical thickness of the high refraction material layer and the low refraction material layer, the same conditions apply as in Comparative example 1.

Comparative example 4 is Glass(1.52)/(1.75H0.25L)^4 (2m+0.5597)H(0.25L1.75H)^4/Air(1.0), and besides changing the ratio of optical thickness of the high refraction material layer and the low refraction material layer, the same conditions apply as in Comparative example 1.

Example 1 is Glass(1.52)/(1.2H0.8L)^4 (2m+0.1560)H (0.8L1.2H)^4/Air(1.0), and besides changing the ratio of optical thickness of the high refraction material layer and the low refraction material layer, the same conditions apply as in Comparative example 1.

Example 2 is Glass(1.52)/(1.25H0.75L)^4 (2m+0.1945)H (0.75L1.25H)^4/Air(1.0), and besides changing the ratio of optical thickness of the high refraction material layer and the low refraction material layer, the same conditions apply as in Comparative example 1.

Example 3 is Glass(1.52)/(1.3H0.7L)^4 (2m+0.2325)H (0.7L1.3H)^4/Air(1.0), and besides changing the ratio of optical thickness of the high refraction material layer and the low refraction material layer, the same conditions apply as in Comparative example 1.

Example 4 is Glass(1.52)/(1.5H0.5L)^4 (2m+0.3727)H (0.5L1.5H)^4/Air(1.0), and besides changing the ratio of optical thickness of the high refraction material layer and the low refraction material layer, the same conditions apply as in Comparative example 1.

Experiment Example 1

Optical Filter Performance Comparison Experiment According to Change of Design

Using the optical thin film design software programs generally used in the current research or industrial field, for the designed optical filter of Comparative examples 1 to 4 and Examples 1 to 4, tests were performed to compare and measure the differences of effect of the central wavelength of 950 nm and the band shift effects compared to Comparative example 1.

Table 1 below is a result of measuring Band Shift(nm) values by incidence angle when m of the spacer layer is 1.

TABLE 1

| | Band Shift (nm) @ m = 1 | | | | | | | | | | | |
| --- | --- | --- | --- | --- | --- | --- | --- | --- | --- | --- | --- | --- |
| | | | | | ∇ Lamda (nm) | | | | ∇ Lamda (%) | | | |
| | 15 deg | 30 deg | 45 deg | 60 deg | 15 deg | 30 deg | 45 deg | 60 deg | 15 deg | 30 deg | 45 deg | 60 deg |
| Comparative example 1 | 3.54 | 13.40 | 26.60 | 40.10 | 0.00 | 0.00 | 0.00 | 0.00 | 0.00 | 0.00 | 0.00 | 0.00 |
| Comparative example 2 | 3.42 | 12.80 | 25.80 | 38.87 | 0.12 | 0.60 | 0.80 | 1.23 | 0.01 | 0.06 | 0.08 | 0.13 |
| Comparative example 3 | 3.35 | 12.61 | 25.37 | 38.25 | 0.19 | 0.79 | 1.23 | 1.85 | 0.02 | 0.08 | 0.13 | 0.19 |
| Comparative example 4 | 2.70 | 10.30 | 20.60 | 30.90 | 0.84 | 3.10 | 6.00 | 9.20 | 0.09 | 0.33 | 0.63 | 0.97 |
| Example 1 | 3.35 | 12.45 | 24.98 | 37.59 | 0.19 | 0.95 | 1.62 | 2.51 | 0.02 | 0.10 | 0.17 | 0.26 |
| Example 2 | 3.20 | 12.20 | 24.50 | 37.00 | 0.34 | 1.20 | 2.10 | 3.10 | 0.04 | 0.13 | 0.22 | 0.33 |
| Example 3 | 3.19 | 12.02 | 24.12 | 36.42 | 0.35 | 1.38 | 2.48 | 3.68 | 0.04 | 0.15 | 0.26 | 0.39 |
| Example 4 | 3.00 | 11.30 | 22.70 | 34.00 | 0.54 | 2.10 | 3.90 | 6.10 | 0.06 | 0.22 | 0.41 | 0.64 |

Table 2 below is a result of measuring Band Shift(nm) values by incidence angle when m of the spacer layer is 2.

TABLE 2

| | Band Shift (nm) @ m = 2 | | | | | | | | | | | |
| --- | --- | --- | --- | --- | --- | --- | --- | --- | --- | --- | --- | --- |
| | | | | | ∇ Lamda (nm) | | | | ∇ Lamda (%) | | | |
| | 15 deg | 30 deg | 45 deg | 60 deg | 15 deg | 30 deg | 45 deg | 60 deg | 15 deg | 30 deg | 45 deg | 60 deg |
| Comparative example 1 | 3.40 | 12.26 | 24.63 | 37.12 | 0.00 | 0.00 | 0.00 | 0.00 | 0.00 | 0.00 | 0.00 | 0.00 |
| Comparative example 2 | 3.19 | 11.95 | 23.97 | 36.11 | 0.21 | 0.31 | 0.66 | 1.01 | 0.02 | 0.03 | 0.07 | 0.11 |
| Comparative example 3 | 3.11 | 11.79 | 23.70 | 35.68 | 0.29 | 0.47 | 0.93 | 1.44 | 0.03 | 0.05 | 0.10 | 0.15 |
| Comparative example 4 | 2.60 | 10.00 | 20.30 | 30.50 | 0.80 | 2.26 | 4.33 | 6.62 | 0.08 | 0.24 | 0.46 | 0.70 |
| Example 1 | 3.11 | 11.67 | 23.42 | 35.25 | 0.29 | 0.59 | 1.21 | 1.87 | 0.03 | 0.06 | 0.13 | 0.20 |
| Example 2 | 3.10 | 11.60 | 23.20 | 34.90 | 0.30 | 0.66 | 1.43 | 2.22 | 0.03 | 0.07 | 0.15 | 0.23 |
| Example 3 | 3.04 | 11.40 | 22.80 | 34.40 | 0.36 | 0.86 | 1.83 | 2.72 | 0.04 | 0.09 | 0.19 | 0.29 |
| Example 4 | 2.90 | 10.90 | 21.70 | 32.90 | 0.50 | 1.36 | 2.93 | 4.22 | 0.05 | 0.14 | 0.31 | 0.44 |

Table 3 below is a result of measuring Band Shift(nm) values by incidence angle when m of the spacer layer is 3.

TABLE 3

| | Band Shift (nm) @ m = 3 | | | | | | | | | | | |
| --- | --- | --- | --- | --- | --- | --- | --- | --- | --- | --- | --- | --- |
| | | | | | ∇ Lamda (nm) | | | | ∇ Lamda (%) | | | |
| | 15 deg | 30 deg | 45 deg | 60 deg | 15 deg | 30 deg | 45 deg | 60 deg | 15 deg | 30 deg | 45 deg | 60 deg |
| Comparative example 1 | 3.20 | 11.70 | 23.50 | 35.30 | 0.00 | 0.00 | 0.00 | 0.00 | 0.00 | 0.00 | 0.00 | 0.00 |
| Comparative example 2 | 3.07 | 11.44 | 22.92 | 34.47 | 0.13 | 0.26 | 0.58 | 0.83 | 0.01 | 0.03 | 0.06 | 0.09 |
| Comparative example 3 | 3.04 | 11.28 | 22.68 | 34.16 | 0.16 | 0.42 | 0.82 | 1.14 | 0.02 | 0.04 | 0.09 | 0.12 |
| Comparative example 4 | 2.60 | 10.00 | 20.00 | 30.30 | 0.60 | 1.70 | 3.50 | 5.00 | 0.06 | 0.18 | 0.37 | 0.53 |
| Example 1 | 2.90 | 11.17 | 22.49 | 33.85 | 0.30 | 0.53 | 1.01 | 1.45 | 0.03 | 0.06 | 0.11 | 0.15 |
| Example 2 | 2.90 | 11.20 | 22.20 | 33.60 | 0.30 | 0.50 | 1.30 | 1.70 | 0.03 | 0.05 | 0.14 | 0.18 |
| Example 3 | 2.90 | 11.01 | 22.02 | 33.19 | 0.30 | 0.69 | 1.48 | 2.11 | 0.03 | 0.07 | 0.16 | 0.22 |
| Example 4 | 2.90 | 10.60 | 21.20 | 31.90 | 0.30 | 1.10 | 2.30 | 3.40 | 0.03 | 0.12 | 0.24 | 0.36 |

Table 4 below is a result of measuring Band Shift(nm) values by incidence angle when m of the spacer layer is 4.

TABLE 4

| | Band Shift (nm) @ m = 4 | | | | | | | | | | | |
|---|---|---|---|---|---|---|---|---|---|---|---|---|
| | | | | | ∇ Lamda (nm) | | | | ∇ Lamda (%) | | | |
| | 15 deg | 30 deg | 45 deg | 60 deg | 15 deg | 30 deg | 45 deg | 60 deg | 15 deg | 30 deg | 45 deg | 60 deg |
| Comparative example 1 | 3.04 | 11.30 | 22.60 | 34.00 | 0.00 | 0.00 | 0.00 | 0.00 | 0.00 | 0.00 | 0.00 | 0.00 |
| Comparative example 2 | 2.92 | 11.09 | 22.22 | 33.42 | 0.12 | 0.21 | 0.38 | 0.58 | 0.01 | 0.02 | 0.04 | 0.06 |
| Comparative example 3 | 2.92 | 10.93 | 22.02 | 33.11 | 0.12 | 0.37 | 0.58 | 0.89 | 0.01 | 0.04 | 0.06 | 0.09 |
| Comparative example 4 | 2.60 | 9.90 | 20.00 | 30.00 | 0.44 | 1.40 | 2.60 | 4.00 | 0.05 | 0.15 | 0.27 | 0.42 |
| Example 1 | 2.92 | 10.89 | 21.87 | 32.84 | 0.12 | 0.41 | 0.73 | 1.16 | 0.01 | 0.04 | 0.08 | 0.12 |
| Example 2 | 2.90 | 10.90 | 21.80 | 32.60 | 0.14 | 0.40 | 0.80 | 1.40 | 0.01 | 0.04 | 0.08 | 0.15 |
| Example 3 | 2.84 | 10.70 | 21.48 | 32.30 | 0.20 | 0.60 | 1.12 | 1.70 | 0.02 | 0.06 | 0.12 | 0.18 |
| Example 4 | 2.81 | 10.40 | 20.90 | 31.30 | 0.23 | 0.90 | 1.70 | 2.70 | 0.02 | 0.09 | 0.18 | 0.28 |

According to the above test results, in the case of Examples 1 to 4, under the condition where the incidence angle is within the range of change of 0 to 45 degrees, it is shown that Band Shift Values are limited to be below 25 nm (24.98 nm in 45 degrees in Example 1), and under the condition where the incidence angle is within the range of change of 0 to 60 degrees, it is shown that the Band Shift Values are limited to be below 38 nm (37.59 nm in 60 degrees in Example 1). Here, it is shown that the ratio of (optical thickness of the high refraction material layer/ optical thickness of the low refraction material layer) corresponding to Examples 1 to 4 change within the range of 1.5 to 3.0.

On the other hand, in the case of Comparative examples 1 to 3, the ratio of (optical thickness of the high refraction material layer/optical thickness of the low refraction material layer) is shown as 1 (Comparative example 1), about 1.2 (Comparative example 2), and about 1.35 (Comparative example 3), respectively. An optical filter that is actually prepared must have the receptivity of a certain level or above for a wide incidence angle of the transmitted light, but Comparative examples 1 to 3 show low improvement level of band shift under the same conditions compared to Examples 1 to 4.

For example, under the condition of m=1 in Comparative example 3, when the incidence angle is 30 degrees, ∇ Lamda(%), which is the band shift value of the central wavelength in comparison to Comparative example 1, becomes 0.1 or below, and thus it is a level that is difficult to be applied in terms of effect of the optical filter being prepared.

Further, in the case of Comparative example 4, the band shift value itself showed the most excellent figure, but the ratio of (optical thickness of the high refraction material layer/optical thickness of the low refraction material layer) is 7, and thus there is a problem because due to the properties of the optical filter (band pass filter) used in the sensor system, additional mirror layer must be formed, which results in the need for a greater number of optical thin film layers, leading to an increase in process time and cost required for preparing an optical filter, thereby lowering productivity.

Example 2

Preparing Halogenated Amorphous Silicon

A hydrogenated amorphous silicon and halogenated amorphous silicon thin film is prepared using a META-MODE magnetron sputtering device, that is based on Reactive Magnetron sputtering, which is one of the physical vapor deposition (PVD) methods.

Si Cathode is placed at left and right sides of a substrate carrier that rotates around a center of a chamber. Through this, Magnetron sputtering is performed, so as to coat silicon (Si) on top of Glass Substrate in units of angstrom, and then Ar is introduced into an Induction Coupled Plasma (ICP) to obtain a high density plasma, wherein the reactive gas, $Cl_2$, and the carrier gas, $H_2$, are introduced. H+ and Cl+ induce a reaction with already deposited Si to obtain hydrogenated silicon (a-Si: H), halogenated silicon (Si:Cl), or a complex compound thereof, $SiCl_xH_{(1-x)}$, and by repeating such a process, a thin film with the intended optical thickness is obtained. Before the process, in order to minimize the remaining gas in the coating chamber other than the required process gases (Ar, Cl, $H_2$, etc.), gas is exhausted until about $1.0*10^{-6}$ mbar, and then the process gases are introduced to start the process. The electrical conductivity of Si, which is the cathode of sputtering, is adjusted to enable the process of DC (Pulsed DC) magnetron. A Sheath Heater is used as a heating source to ensure that the base material temperature is in a certain range during the process. Further, in order to obtain a homogeneous thin film, the rotation speed of the substrate carrier where the base material is located should be about 100 rpm or more, and the optical transmittance is measured in real time during the process by using the Insitu Optical Monitoring System that can optically measure the thickness change of the thin film during the process.

Other specific process conditions are as in Table 5 below.

TABLE 5

| | |
|---|---|
| Process Pressure (mbar) | 1.3~1.4E−3 |
| Ar for Si Cathode | 80 sccm |
| Deposition Rate | 0.4 nm/sec |
| Plasma Source | rf-6 Kw |
| Ar for Plasma Source | 100 sccm |
| $H_2$ for Plasma Source | 25~40 sccm |
| Cl for Plasma Source | 0~15 sccm |
| Substrate Temp | 180° C. |

As a result, by varying the flow rate of the $H_2$ gas and the $Cl_2$ gas being input into the chamber as shown in Table 6 below, a hydrogenated amorphous silicon and halogenated amorphous silicon thin film is prepared according to the conditions of Comparative examples 1 and 2, and Examples 1 to 3. The thin film prepared according to Comparative example 1 is hydrogenated amorphous silicon (A-SiH), and the thin film prepared according to Examples 1 to 3 and Comparative example 2 is halogenated amorphous silicon (a-SiClH).

TABLE 6

| | Comparative example 1 | Example 1 | Example 2 | Example 3 | Comparative example 2 |
|---|---|---|---|---|---|
| $H_2$ (sccm) | 40 | 35 | 32.5 | 27.5 | 25 |
| $Cl_2$ (sccm) | 0 | 5 | 7.5 | 12.5 | 15 |
| $Cl_2/(H_2 + Cl_2)$ (sccm) | 0 | 0.125 | 0.188 | 0.313 | 0.375 |

Experiment Example 2

Optical Performance Comparison Experiment of Halogenated Amorphous Silicon

In order to compare the optical properties of the thin films prepared according to Comparative examples 1 and 2, and Examples 1 to 3, the transmittance and refractive index at the transmitted wavelength for each prepared thin film are measured using a Spectro-Photometer.

Measurement results of the transmittances are summarized in Table 7 below, and measurement results of the refractive indexes are summarized in Table 8 below.

TABLE 7

| | Transmittance (%) | | | | |
|---|---|---|---|---|---|
| Wavelength (nm) | Comparative example (0%) | Example 1 (12.50%) | Example 2 (18.70%) | Example 3 (31.20%) | Comparative example 2 (37.50%) |
| 800 | 34.16 | 33.02 | 33.42 | 33.95 | 34.30 |
| 840 | 34.91 | 33.71 | 34.10 | 34.66 | 35.00 |
| 880 | 35.60 | 34.37 | 34.78 | 35.33 | 35.70 |
| 920 | 35.92 | 34.67 | 35.09 | 35.64 | 36.00 |
| 960 | 36.28 | 35.03 | 35.45 | 36.01 | 36.37 |
| 1000 | 36.63 | 35.36 | 35.79 | 36.36 | 36.72 |
| 1040 | 36.96 | 35.68 | 36.09 | 36.67 | 37.04 |
| 1080 | 37.28 | 35.99 | 36.40 | 36.99 | 37.36 |
| 1120 | 37.36 | 36.06 | 36.50 | 37.07 | 37.44 |
| 1200 | 37.44 | 36.14 | 36.58 | 37.15 | 37.52 |

Figure 3:
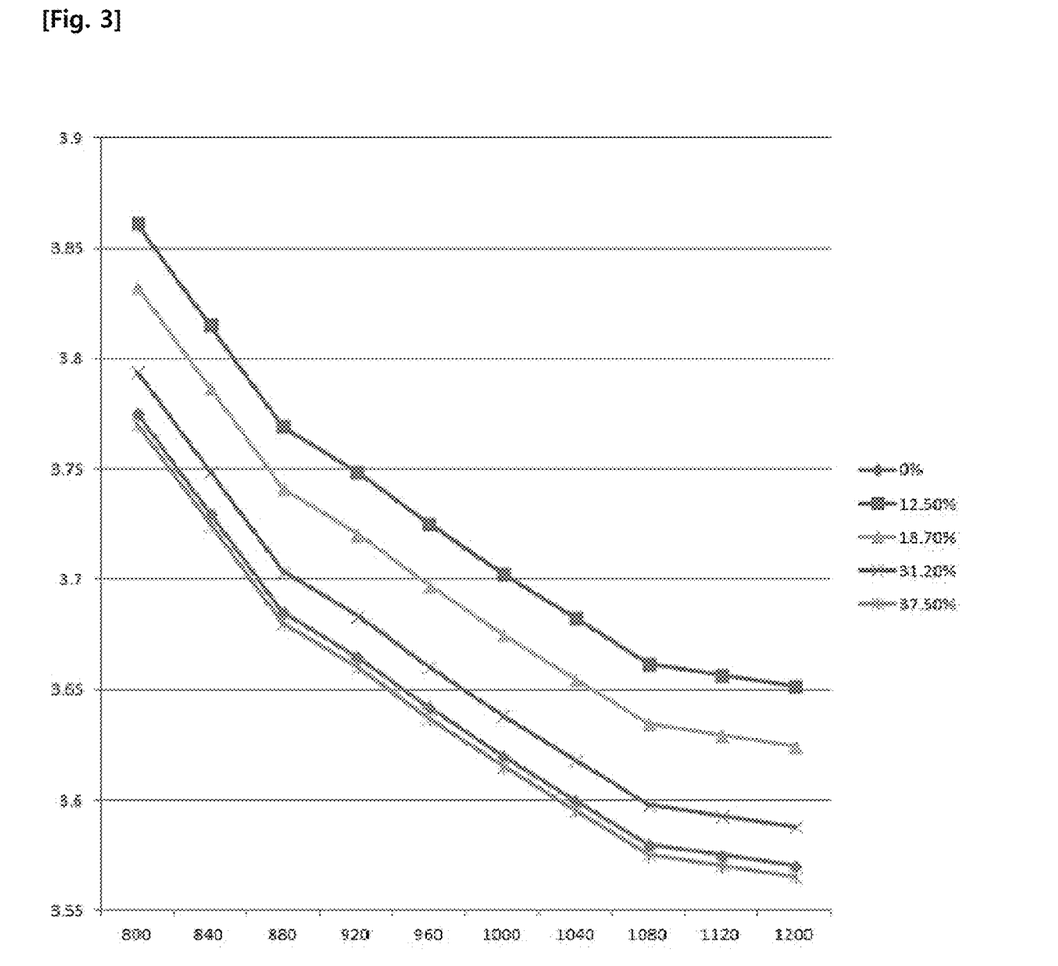
FIG. 3 is a view illustrating the data of Table 8 in the present specification, shown in a graph form.

FIG. 3 is a view illustrating the data of Table 8 in a graph form. X axis represents the wavelength (nm) and the Y axis represents the refractive index.

TABLE 8

| | N(Refractive Index) | | | | |
|---|---|---|---|---|---|
| Wavelength (nm) | Comparative example (0%) | Example 1 (12.5%) | Example 2 (18.7%) | Example 3 (31.2%) | Example 2 (37.5%) |
| 800 | 3.775 | 3.861 | 3.832 | 3.794 | 3.770 |
| 840 | 3.73 | 3.815 | 3.787 | 3.749 | 3.725 |
| 880 | 3.685 | 3.769 | 3.741 | 3.704 | 3.680 |
| 920 | 3.665 | 3.749 | 3.721 | 3.684 | 3.660 |
| 960 | 3.642 | 3.725 | 3.697 | 3.660 | 3.637 |
| 1000 | 3.62 | 3.703 | 3.675 | 3.638 | 3.615 |
| 1040 | 3.6 | 3.682 | 3.655 | 3.618 | 3.595 |
| 1080 | 3.58 | 3.662 | 3.635 | 3.598 | 3.575 |
| 1120 | 3.575 | 3.657 | 3.629 | 3.593 | 3.570 |
| 1200 | 3.57 | 3.652 | 3.624 | 3.588 | 3.565 |

Referring to Table 8 and FIG. 3, when comparing with the hydrogenated amorphous silicon (Comparative example 1), one can see that Examples 1 to 3 show excellent optical refractive indexes of about 3.593 to 3.861 (800 nm to 1100 nm). However, when the flow rate of $Cl_2$ gas being input into the chamber exceeds 37.5% as in the case of Comparative example 2, one can see that it shows a similar level of refractive index as the hydrogenated amorphous silicon of Comparative example 1.

In order to compare the optical properties of the thin films prepared according to Comparative example 1, Example 2 and Comparative example 2, measurement results of extinction coefficients according to the transmitted wavelength for each of the prepared thin film are summarized in Table 8.

Figure 4:
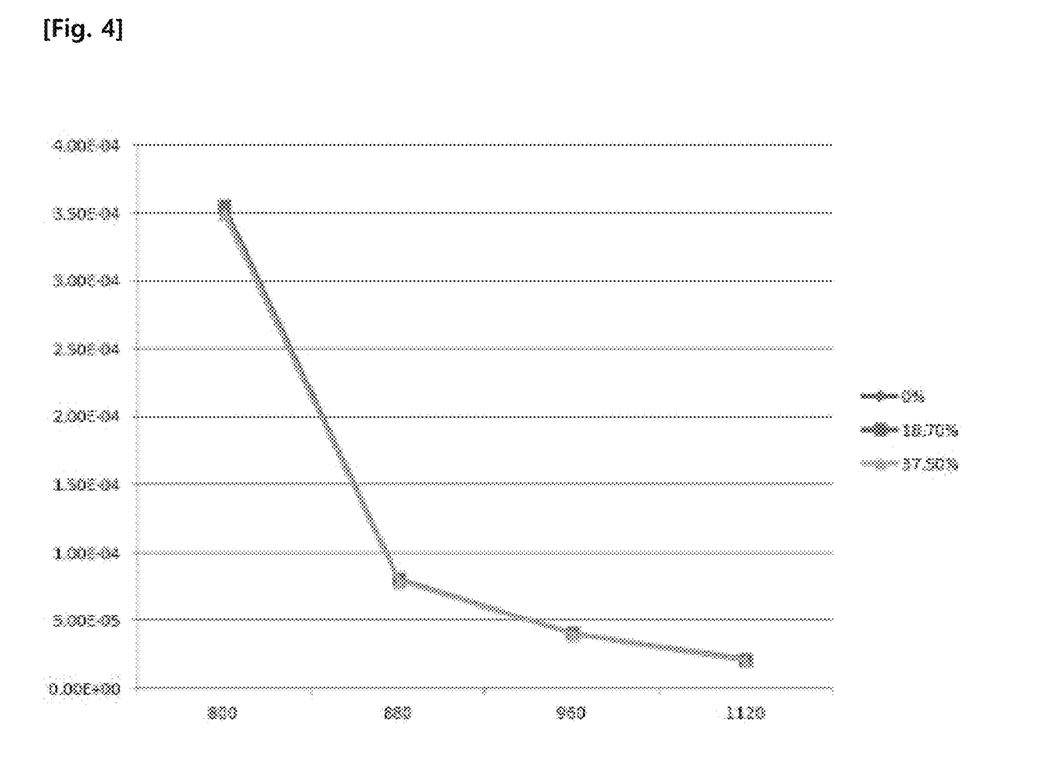
FIG. 4 is a view illustrating the data of Table 9 in the present specification, shown in a graph form.

FIG. 4 illustrates the data of Table 9 in a graph form. X axis represents the wavelength (nm) and Y axis represents the extinction coefficient (K).

TABLE 9

| | K(Extinction Coefficient) | | |
|---|---|---|---|
| Wavelength (nm) | Comparative example 1 (0%) | Example 2 (18.7%) | Example 2 (37.5%) |
| 800 | 3.50E−04 | 3.55E−04 | 3.50E−04 |
| 880 | 8.00E−05 | 8.12E−05 | 7.99E−05 |
| 960 | 4.00E−05 | 4.06E−05 | 3.99E−05 |
| 1120 | 2.10E−05 | 2.13E−05 | 2.1E−05 |

Referring to Table 9 and FIG. 4, in the wavelength range of about 800 nm to 1100 nm, the amorphous hydrogenated silicon (Comparative example 1) and the halogenated amorphous silicon (Example 2 and Comparative example 2) show equivalent level of extinction coefficient.

What is claimed is:
1. An optical filter comprising:
   a first mirror layer where a first high refraction material layer and a first low refraction material layer are alternately deposited;

a spacer layer continuously deposited on one side surface of the first mirror layer, and comprises a plurality of second high refraction material layers; and a second mirror layer located to face the first mirror layer with the spacer layer interposed therebetween, and where a third high refraction material layer and a third low refraction material layer are alternately deposited, wherein one or more of the first high refraction material layer, the first low refraction material layer, the second high refraction material layer, the third high refraction material layer, and the third low refraction material layer comprise a halogenated amorphous silicon, and in a wavelength range of 800 nm to 1100 nm, the one or more of the first high refraction material layer, the second high refraction material layer, and the third high refraction material layer, comprising the halogenated amorphous silicon, have a refractive index of 3.0 or more, and an optical extinction coefficient of 0.001 or below.

2. The optical filter according to claim 1,
wherein a ratio of (optical thickness of the first high refraction material layer/optical thickness of the first low refraction material layer) or (optical thickness of the third high refraction material layer/optical thickness of the third low refraction material layer) is 1.5 to 3.0.

3. The optical filter according to claim 2,
wherein the optical filter has a transmission band of a wavelength range of 800 nm to 1100 nm, and a central wavelength of 950 nm is band shifted to below 25 nm at most according to an incidence angle change of 0 to 45 degrees.

4. The optical filter according to claim 2,
wherein the optical filter has a transmission band of a wavelength range of 800 nm to 1100 nm, and a central wavelength of 950 nm is band shifted to below 38 nm at most according to an incidence angle change of 0 to 60 degrees.

5. The optical filter according to claim 1,
wherein the halogenated amorphous silicon comprises F or Cl.

6. The optical filter according to claim 1,
wherein the first high refraction material layer, the second high refraction material layer, and the third high refraction material layer have a refractive index identical to one another, and
the first low refraction material layer and the third low refraction material layer have a refractive index identical to each other.

7. The optical filter according to claim 1,
wherein the halogenated amorphous silicon is prepared using a PVD method comprising a step of introducing an inert gas, a halogen gas and a carrier gas into a chamber, and
a ratio of volume of the halogen gas/(volume of the halogen gas+volume of the carrier gas) being introduced into the chamber during a same period of time is above 0 and below 0.375.

8. The optical filter according to claim 1,
wherein the first low refraction material layer and the third low refraction material layer comprises one or more of $TiO_2$, $Nb_2O_5$, $Ta_2O_5$, $Si_3N_4$, $SiO_2$, $MgF_2$, $Al_2O_3$, halogenated amorphous silicon compound, or a mixture thereof.

9. The sensor system according to claim 1,
wherein a ratio of (optical thickness of the first high refraction material layer/optical thickness of the first low refraction material layer) or (optical thickness of the third high refraction material layer/optical thickness of the third low refraction material layer) is 1.5 to 3.0, thereby causing a central wavelength to be band shifted to below 25 nm according to an incidence angle change of 0 to 45 degrees.

10. A method for preparing a halogenated amorphous silicon thin film for an optical filter,
being prepared using a PVD method comprising a step of introducing an inert gas, a halogen gas, and a carrier gas into a chamber, and
a ratio of volume of the halogen gas/(volume of the halogen gas+volume of the carrier gas) being introduced into the chamber during a same period of time is above 0 and below 0.375, and
wherein the halogenated amorphous silicon thin film is used in one or more of a first high refraction material layer, a first low refraction material layer, a second high refraction material layer, a third high refraction material layer, and a third low refraction material layer of the optical filter, and
in a wavelength range of 800 nm to 1100 nm, the one or more of the first high refraction material layer, the second high refraction material layer, and the third high refraction material layer, comprising the halogenated amorphous silicon, have a refractive index of 3.0 or more, and an optical extinction coefficient of 0.001 or below.

11. A sensor system comprising:
an optical filter that includes
a first mirror layer where a first high refraction material layer and a first low refraction material layer are alternately deposited;
a spacer layer continuously deposited on one side surface of the first mirror layer, and comprises a plurality of second high refraction material layers; and
a second mirror layer located to face the first mirror layer with the spacer layer interposed therebetween, and where a third high refraction material layer and a third low refraction material layer are alternately deposited,
wherein one or more of the first high refraction material layer, the first low refraction material layer, the second high refraction material layer, the third high refraction material layer, and the third low refraction material layer comprise a halogenated amorphous silicon, and
in a wavelength range of 800 nm to 1100 nm, the one or more of the first high refraction material layer, the second high refraction material layer, and the third high refraction material layer, comprising the halogenated amorphous silicon, have a refractive index of 3.0 or more, and an optical extinction coefficient of 0.001 or below; and
a light source emitting light of a wavelength range of 800 nm to 1100 nm in order to generate a reflected light reaching the optical filter; and
a sensor disposed on a processing path of the reflected light passing through the optical filter, and receives 3D information about a subject, included in the reflected light.

* * * * *